(12) United States Patent
Willcox et al.

(10) Patent No.: US 12,146,854 B2
(45) Date of Patent: Nov. 19, 2024

(54) GALVANIC CURRENT PROTECTION FOR PHOTOIONIZATION DETECTOR

(71) Applicant: Mocon, Inc., Brookyln Park, MN (US)

(72) Inventors: Charles Willcox, Hopkins, MN (US); David Jennings, Edina, MN (US); Christopher Fields, Coon Rapids, MN (US)

(73) Assignee: MOCON, INC., Brooklyn Park, MN (US)

( * ) Notice: Subject to any disclaimer, the term of this patent is extended or adjusted under 35 U.S.C. 154(b) by 150 days.

(21) Appl. No.: 18/176,624

(22) Filed: Mar. 1, 2023

(65) Prior Publication Data

US 2024/0295528 A1    Sep. 5, 2024

(51) Int. Cl.
*G01N 27/64* (2006.01)
*G01N 27/66* (2006.01)
*H01J 47/02* (2006.01)

(52) U.S. Cl.
CPC ............. *G01N 27/64* (2013.01); *G01N 27/66* (2013.01); *H01J 47/02* (2013.01)

(58) Field of Classification Search
CPC ......... G01N 27/64; G01N 27/66; H01J 47/02; H05K 3/3447; H05K 1/116; H05K 2201/0979; H05K 2203/046; H01L 23/481
USPC ........................................................ 324/464
See application file for complete search history.

(56) References Cited

U.S. PATENT DOCUMENTS

| | | |
|---|---|---|
| 7,046,012 B2 | 5/2006 | Dean et al. |
| 11,037,778 B1 | 6/2021 | Dolgov et al. |
| 2003/0075679 A1* | 4/2003 | Syage .................. H01J 49/162 250/288 |
| 2003/0137306 A1 | 7/2003 | Dolgov et al. |
| 2015/0130473 A1* | 5/2015 | Agah .................... G01N 27/68 324/464 |
| 2020/0333292 A1* | 10/2020 | Su .......................... G01N 27/62 |
| 2022/0187245 A1 | 6/2022 | Xu et al. |

OTHER PUBLICATIONS

European Search Report pertaining to corresponding European Patent Application No. 23164049.1, dated Oct. 2, 2023.

(Continued)

*Primary Examiner* — Raul J Rios Russo
(74) *Attorney, Agent, or Firm* — GRUMBLES LAW PLLC; Brittany Haanan

(57) ABSTRACT

A photoionization detector comprised of a sensor having at least a collector electrode and a grounding electrode, a gas discharge lamp that ionizes molecules of interest to create ionized molecules and electrons, and an amplifier connected to the collector electrode. Each of the collector electrode and the grounding electrode include a feed-thru pin, an inner trace surrounding the feed-thru pin, an outer trace surrounding the inner trace, wherein the outer trace on each electrode is comprised of the same material, a channel between the inner trace and the outer trace, wherein the channel is comprised of a different material than the outer trace and the inner trace, and a bridge connecting the outer trace with the inner trace. The ionized molecules are collectable by a bias electrode and electrons are collectable by the collector electrode.

17 Claims, 3 Drawing Sheets

(56) References Cited

OTHER PUBLICATIONS

Ametek Mocon, piD-TECH eVx Photoionization Sensors, https://www.ametekmocon.com/products/oemphotoionization/pidtechevxphotoionizationdetector, accessed May 15, 2023.

Ametek Mocon, piD-TECH eVx User Manual 143-175 Rev 1.1, pp. 1-21.

On Science Ltd., MiniPID 2 (3PIN) Manual, Unrivalled Gas Detection, pp. 1-32.

Rae Systems by Honeywell, The PID Handbook—Theory and Applications of Direct-Reading Photoionzation Detectors (PID), www.raesystems.com.

Tektronix, Keithley, "Low Level Measurements Handbook—7th Edition. Precision DC Current, Voltage, and Resistance Measurements".

* cited by examiner

GALVANIC CURRENT PROTECTION FOR PHOTOIONIZATION DETECTOR

FIELD OF THE INVENTION

This disclosure relates to an improved photoionization detector. More specifically, it relates to a photoionization detector sensor having conductors with unique geometry that reduces or prevents galvanic currents.

BACKGROUND OF THE INVENTION

Photoionization detectors (PIDs) are handheld, portable gas detectors used to measure volatile organic compounds (VOCs), such as benzene, and other organic gases by ionizing environmental gases and measuring the generated electrons. They can produce instantaneous readings and can operate continuously, which make them useful when monitoring for health and safety in military, industrial, and confined working facilities. However, since PID sensors are capable of creating current levels down to the femtoampere range proportional to the concentration of an ionized gas being measured, galvanic currents that arise in the presence of electrolytes bridging two conductors comprised of different materials are a potential source of error in PID sensors and, therefore, limit the sensitivity of the detector. More specifically, a galvanic current can arise when two electrodes, each comprised of a different metal having different galvanic potentials, are bridged by an electrolyte. When galvanic currents arise, they can create errors in the readout by showing either higher or lower readings.

Current art has focused on cleanliness of the materials to minimize the effect of stray currents and the formation of electrolytes in humid environments. However, better protective features are needed that provide protection from extraneous galvanic currents and allow for a more accurate and sensitive detector that is capable of use in more extreme (i.e., humid) environments.

SUMMARY OF THE INVENTION

The present disclosure relates to a photoionization detector sensor having conductors with unique geometry that reduces or prevents galvanic currents. In an illustrative but non-limiting example, the disclosure provides a photoionization detector that can include a sensor comprised of at least a collector electrode and a grounding electrode, a gas discharge lamp that ionizes molecules of interest to create ionized molecules and electrons, and an amplifier connected to the collector electrode. The collector electrode and the grounding electrode can both include a feed-thru pin, an inner trace surrounding the feed-thru pin, an outer trace surrounding the inner trace, a channel between the inner trace and the outer trace, and a bridge connecting the outer trace with the inner trace. The outer trace on each electrode can be comprised of the same material. The channel can be comprised of a different material than the outer trace and the inner trace. The ionized molecules can be collectable by a bias electrode, and the electrons can be collectable by the collector electrode.

In some cases, the channel can be comprised of a hydrophobic material. Further, the hydrophobic material can be polytetrafluoroethylene. In some cases, the inner trace can be comprised of gold-plating. In some cases, the feed-thru pin is soldered in place. Further, the solder can surround the feed-thru pin and cover at least a portion of the inner trace. In some cases, the inner trace, the outer trace, and the bridge can be comprised of the same material. Further, the inner trace, the outer trace, and the bridge are comprised of gold-plated copper.

In some cases, the outer trace can be annular. Further, the feed-thru pin can be centered within the outer trace. In some cases, the bridge on the collector electrode can be on a first side of the collector electrode, the grounding electrode can be nearest a second side of the collector electrode, and the second side of the collector electrode can be opposite the first side of the collector electrode. Further the bridge on the grounding electrode can be on a first side of the grounding electrode, the collector electrode can be nearest a second side of the grounding electrode, and the second side of the grounding electrode can be opposite the first side of the grounding electrode. In some cases, the grounding electrode can be positioned between the bias electrode and the collector electrode.

In another illustrative but non-limiting example, the disclosure provides a photoionization detector sensor that can include at least two electrodes including a collector electrode and a grounding electrode, wherein each electrode can include a feed-thru pin, an inner trace surrounding the feed-thru pin, an outer trace ring surrounding the inner trace, a channel between the inner trace and the outer trace ring, and a bridge connecting the outer trace ring with the inner trace. The outer trace ring on each electrode can be comprised of the same material. The channel can be comprised of a different material than the outer trace ring and the inner trace. The inner trace, the outer trace, and the bridge can be comprised of the same material. The feed-thru pin can be centered within the outer trace. The bridge on the collector electrode can be on an opposite side compared to the bridge on the grounding electrode. In some cases, the photoionization detector sensor can further include a bias electrode. In some cases, the photoionization detector sensor can be combined with a gas discharge lamp that ionizes molecules of interest to create ionized molecules and electrons, and an amplifier connected to the collector electrode. The ionized molecules can be collectable by the bias electrode and the electrons can be collectable by the collector electrode.

In another illustrative, but non-limiting example, the disclosure provides a method of using a photoionization detector that can include activating a gas discharge lamp and reading an output of the amplifier. The gas discharge lamp can ionize molecules of interest to create ionized molecules and electrons. The ionized molecules can be collectable by a bias electrode on a sensor. The electrons can be collectable by a collector electrode on a sensor, wherein the collector electrode can be connected to an amplifier. A grounding electrode on the sensor and the collector electrode can each include a feed-thru pin, an inner trace surrounding the feed-thru pin, an outer trace surrounding the inner trace, a channel between the inner trace and the outer trace, and a bridge connecting the outer trace with the inner trace. The outer traces on the electrodes can be comprised of the same material. The channel can be comprised of a different material than the outer trace and the inner trace. The channel can be configured to minimize galvanic currents.

BRIEF DESCRIPTION OF THE DRAWINGS

FIG. 2b is a bottom view of a prior art photoionization detector sensor of the detector of FIG. 2a.

DETAILED DESCRIPTION

Figure 1:
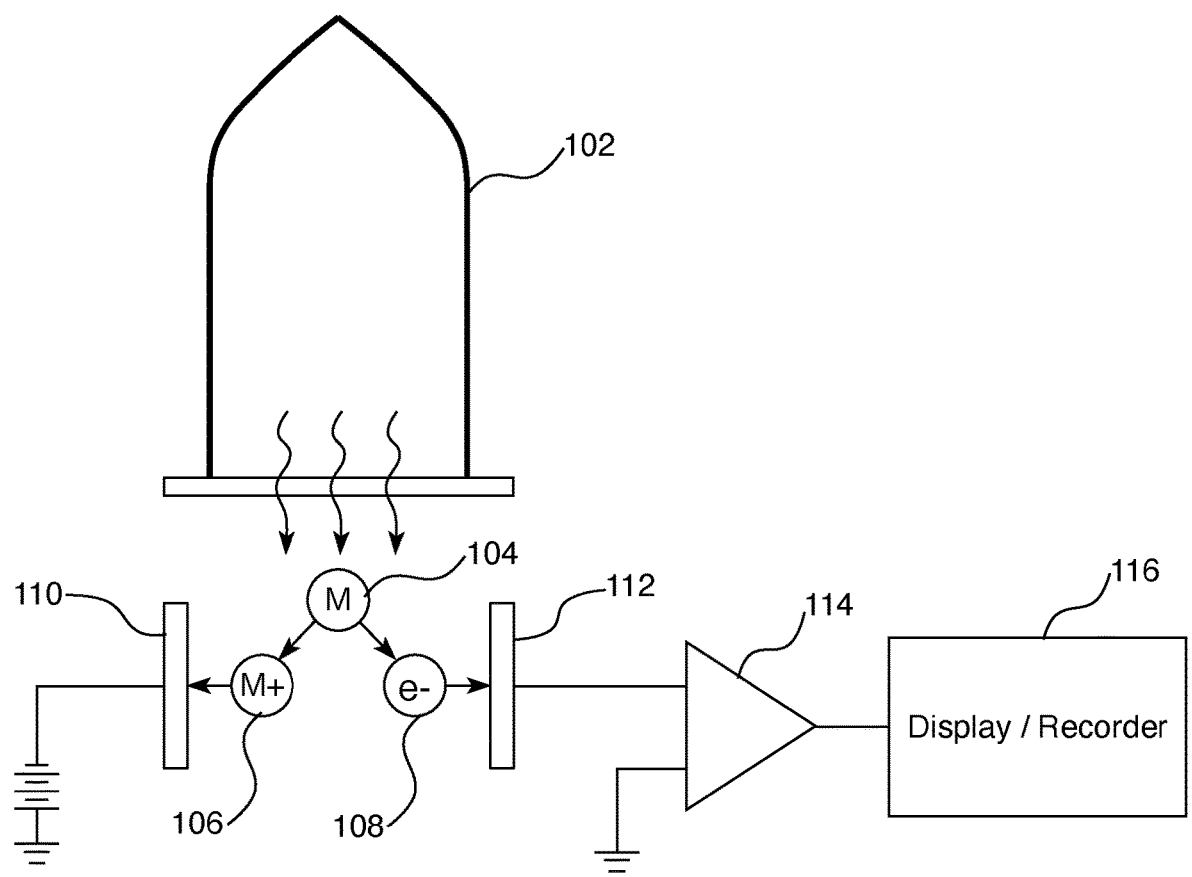
FIG. 1 is a schematic of a photoionization detector.

The present disclosure relates to a photoionization detector sensor (PID sensor) having conductors with unique geometry that reduces or prevents galvanic currents. Various embodiments of the PID sensor will be described in detail with reference to the drawings, wherein like reference numerals represent like parts and assemblies throughout the several views. Reference to various embodiments does not limit the scope of the PID sensor disclosed herein. Additionally, any examples set forth in this specification are not intended to be limiting and merely set forth some of the many possible embodiments for the PID sensor. It is understood that various omissions and substitutions of equivalents are contemplated as circumstances may suggest or render expedient, but these are intended to cover applications or embodiments without departing from the spirit or scope of the disclosure. Also, it is to be understood that the phraseology and terminology used herein are for the purpose of description and should not be regarded as limiting.

Figure 2A:
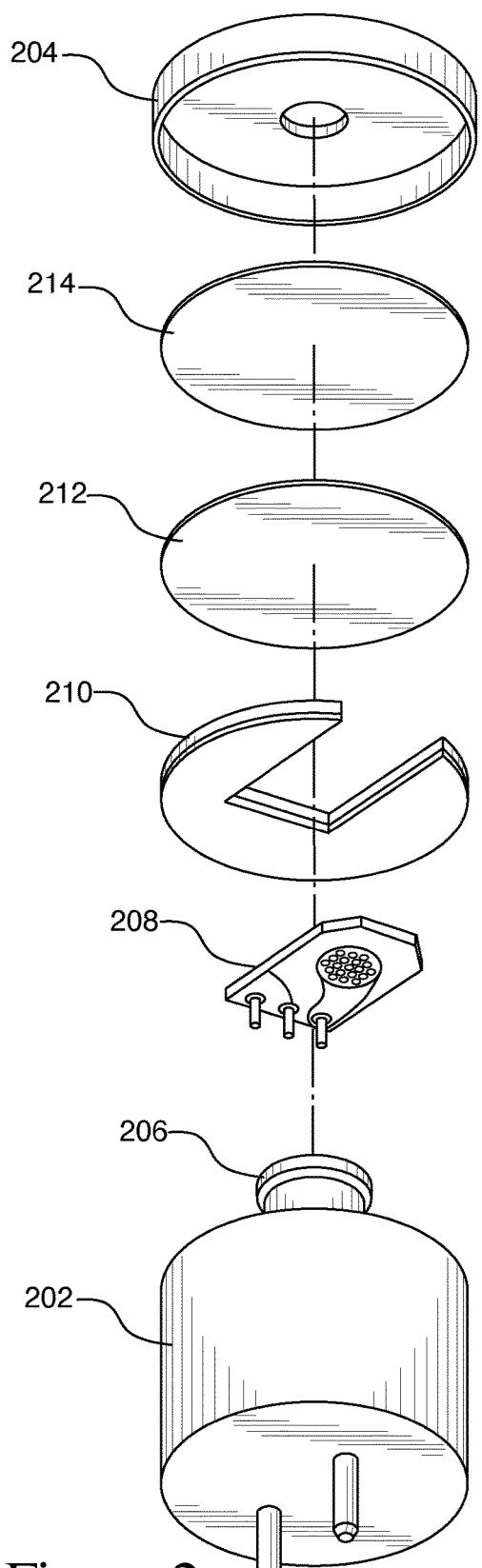
FIG. 2a is an exploded view of a prior art photoionization detector.
Figure 2B:
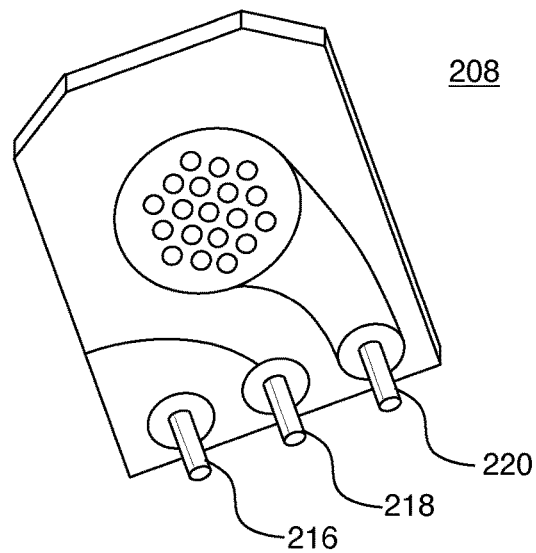
Figure 3:
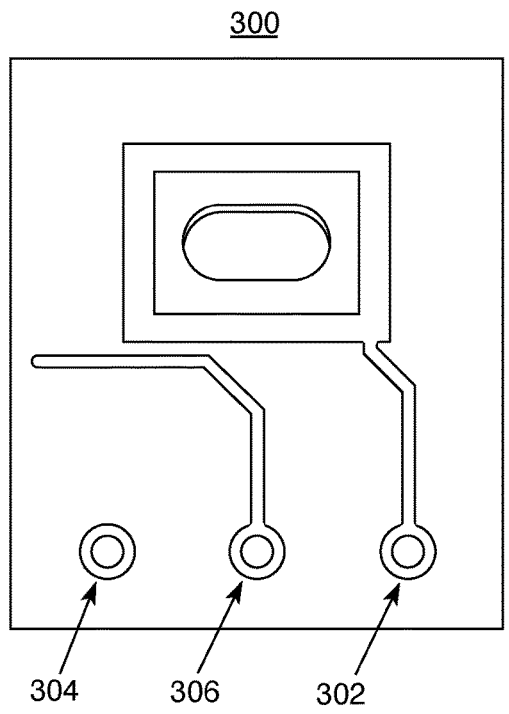
FIG. 3 is a schematic top view of a photoionization detector sensor according to the present disclosure.
Figure 4:
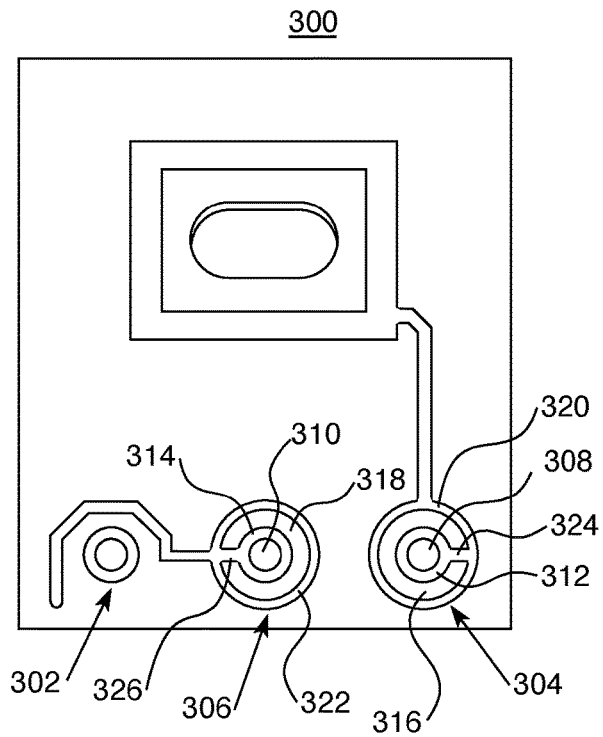
FIG. 4 is a schematic bottom view of the photoionization detector sensor of FIG. 3.
Figure 5:
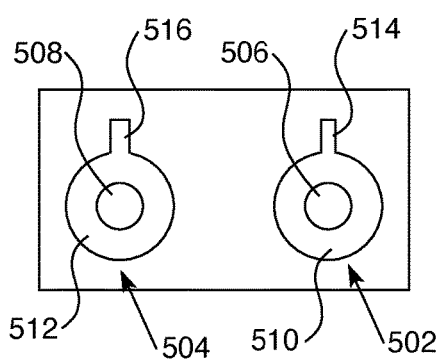
FIG. 5 is a schematic view of prior art photoionization detector sensor electrodes.
Figure 6:
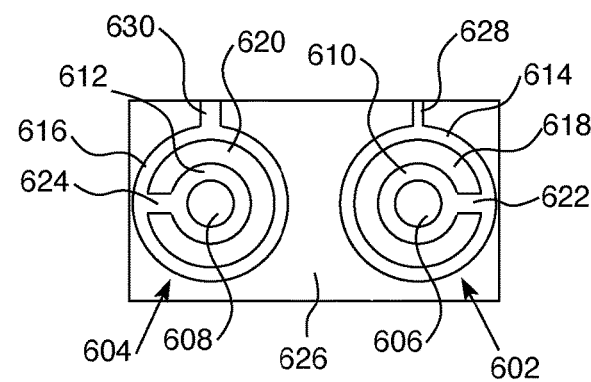
FIG. 6 is a schematic view of the photoionization detector sensor electrodes according to the present disclosure.

FIGS. 1-6 illustrate various views of an example of a photoionization detector according to the present disclosure. FIG. 1 is a schematic of a photoionization detector. FIG. 2a is an exploded view of a prior art photoionization detector. FIG. 2b is a bottom view of a prior art photoionization detector sensor of the detector of FIG. 2a. FIG. 3 is a schematic top view of a photoionization detector sensor according to the present disclosure. FIG. 4 is a schematic bottom view of the photoionization detector sensor of FIG. 3. FIG. 5 is a schematic view of prior art photoionization detector sensor electrodes. FIG. 6 is a schematic view of the photoionization detector sensor electrodes according to the present disclosure.

Some embodiments of PIDs disclosed herein include a sensor having two or more electrodes, a gas discharge lamp, and an amplifier connected to one of the two or more electrodes. The two or more electrodes of the PID sensor can be comprised of a collector electrode, a bias electrode, a grounding electrode, and combinations thereof (ex: a collector electrode and a grounding electrode). The bias electrode and the collector electrode can support an electrostatic field. The grounding electrode can establish a low impedance path back to a supply source to facilitate the operation of the device by intercepting currents that may arise between the bias and collector electrodes (often configured as a guard trace) as well as establish a stable voltage to ground during operation.

As illustrated in FIG. 1, a gas discharge lamp 102 can ionize molecules of interest 104 to create ionized molecules 106 and electrons 108. More specifically, when a UV light source in the gas discharge lamp 102 is activated, it can ionize environmental gases and create ionized molecules 106 and electrons 108. The ionized molecules 106 can be collectable by a bias electrode 110, and the electrons 108 can be collectable by the collector electrode 112. The collector electrode 112 can be connected to the amplifier 114, which can be a high gain transimpedance amplifier that measures the electrons 108 generated from the ionized gas. When the gas 104 is ionized, the electrons 108 produced can be accelerated to the collector electrode 112 by the electrostatic field developed between the bias 110 and the collector 112 electrodes. The results can be sent from the amplifier to a display/record 116 for observance by a user.

Generally, the PID can have components that are contained within a cylindrical housing, as illustrated by the prior art PID 200 in FIG. 2a. More specifically, the cylindrical housing can include a sensor body 202 with a cap 204, wherein the sensor body and cap contain a gas discharge lamp 206 (having a UV light source), a sensor 208, a spacer 210, a filter cloth 212, and a filter 214. The components can be stacked on top of one another, as illustrated in FIG. 2a, and the gas discharge lamp 206 and sensor 208 can be placed adjacent to one another.

As mentioned briefly above, the sensor can include two or more electrodes such as, but not limited to, a bias electrode, a collector electrode, and a grounding electrode. The electrodes 216, 218, 220 can be approximately circular and can be positioned in line with each other, as illustrated in FIG. 2b. In some embodiments, electrode 216 can be a bias electrode, electrode 218 can be a grounding electrode, and electrode 220 can be a collector electrode. Even though the PID in FIG. 2a and the details of the PID sensor in 2b are prior art, their components and layout can remain consistent with the PID and sensor described herein. More specifically, as illustrated in FIGS. 3-4, similar to PID sensor 208 from FIG. 2b, the grounding electrode 306 on the PID sensor 300 can be positioned between the bias electrode 302 and the collector electrode 304.

Prior art electrodes 216, 218 and 220, as illustrated in FIGS. 2a-b, and 502, 504, such as those illustrated in FIG. 5, are approximately circular. Since a voltage differential between bias and collector electrodes can typically be tens or hundreds of volts, a third electrode, a grounding electrode, can be employed to block surface conduction currents that may arise between the bias and collector electrodes. Illustrated in FIG. 5 is a collector electrode 502 and a grounding electrode 504. The collector 502 and grounding 504 electrodes can each include respective feed-thru pins 506, 508 that are electrically connected. Typical materials used in the PID include gold-plated features and tin-containing solders. Solder may be placed over the feed-thru pins 506, 508 and may further cover portions of the inner traces 510, 512 such that the appearance of each electrode is that of an inner trace with solder on top of it.

Unfortunately, if the collector electrode and the grounding electrode are made from metals that are significantly far apart on the galvanic series, a weak battery can result when bridged by a conductive medium. Since the materials used in a PID include gold-plated features and tin-containing solders, these metals, when bridged by a conductive medium, can produce electrochemical voltages in the range of several hundred millivolts. This voltage can appear between the grounding electrode and the collector electrode, which can then feed into the transimpedance amplifier. This stray voltage can drive the transimpedance amplifier in either a positive or negative direction depending on which metal type is connected to the collector electrode and which type is connected to the grounding electrode.

More specifically, and again referring to FIG. 5, in order for a voltage to develop, if an electrolyte is present and two conductive materials of different galvanic potentials are present (for example, a first metal used for the inner trace and a second metal used for the solder), then moisture combined with surface contamination can create a weak electrolyte that bridges the solder on one electrode with the inner trace on a second electrode, therefore potentially resulting in a voltage leading to errors in the VOC measurement. If, however, an electrolyte bridges two identical metals, there will be no voltage developed because both metals have the same galvanic potential. Therefore, one solution to reduce errors in the VOC measurement is to use only one metal type throughout the detector or use only metals that lie close together galvanically. Unfortunately, this may not always be achievable in practical designs.

Therefore, in the present disclosure, the geometry of the electrodes (i.e., conductors) has been designed to minimize the areas where metals of different electrochemical potentials can be bridged by an electrolyte. Specifically, as illustrated in FIG. 6, areas where solder is present on the electrodes 602, 604, such as the feed-thru pins 606, 608 and inner traces 610, 612, are surrounded by outer traces 614, 616 made of a chosen material (for example, gold-plated copper). Therefore, the electrode pattern restricts solder to the inner traces 610, 612 and feed-thru pins 606, 608. Therefore, if or when an electrolyte develops between the electrodes 602, 604, it can bridge the outer traces 614, 616 first. As long as the surrounding outer traces 614, 616 are comprised of the same material (or are comprised of materials lying close galvanically) for any set of electrodes 602, 604 on the sensor, any galvanic effects can be minimized even in the presence of a conducting electrolyte. Therefore, if the solder remains inside the inner traces 610, 612, the chance of mixed metals becoming electrically bridged by a conductive electrolyte is reduced. Even if the electrolyte bridges all the way to the inner traces 610, 612 and comes in contact with the solder, a voltage can develop but will be reduced due to the larger area of the ring electrode relative to the solder area. This improved geometry and architecture removes the limitation of using only the same materials or materials lying close galvanically in order to reduce errors in the VOC measurement. Further, it allows for PID sensors to have less variation in their measurements and also allows for production of higher gain sensors than have been previously feasible. Lastly, the improvement results in a sensor that is less sensitive to atmospheric variation and allows for use of PIDs in the environmental monitoring station market.

As mentioned above, the PID sensor can include at least two electrodes 602, 604, each having a feed-thru pin 606, 608, an inner trace 610, 612 surrounding each feed-thru pin, an outer trace 614, 616 surrounding each inner trace, a channel 618, 620 between each inner trace and outer trace, and a bridge 622, 624 connecting each outer trace with each inner trace. The outer traces 614, 616 on both electrodes can be comprised of the same material. The channel 618, 620 can be comprised of a different material than the outer 614, 616 and inner traces 610, 612.

More specifically, the at least two electrodes can be a collector electrode 602 and a grounding electrode 604 that are located adjacent to one another, as illustrated in FIG. 6. The electrodes 602, 604 can be approximately circular and the feed-thru pins 606, 608 for each electrode can be approximately centered, as illustrated in FIG. 6. The feed-thru pins can be comprised of materials such as bronze, brass, copper, beryllium-copper, stainless steel, which can be plated with, Nickel, Gold, Silver, Platinum, Tin-lead, and Tin-silver. Surrounding the feed-thru pins 606, 608 can be an inner trace 610, 612. The inner trace 610, 612 on each electrode 602, 604 can be circular and can be comprised of materials such as gold-plating (for example, gold-plated copper, silver-plated copper, tin-silver plated copper, and tin-lead plated copper). Each feed-thru pin 606, 608 can be soldered in place in a central portion of the inner traces 610, 612. The solder can surround the feed-thru pins 606, 608 and cover at least a portion of their respective inner traces 610, 612.

Surrounding each inner trace 610, 612 of electrodes 602, 604 can be a channel 618, 620. This channel 618, 620 can be circular or annular and can be comprised of a hydrophobic material such as, but not limited to, polytetrafluoroethylene (i.e., Teflon). In some cases, the channel 618, 620 can be comprised of the same material as the sensor plate 626 that the sensor materials are all connected to. Therefore, in manufacture, it can simply be a gap between the inner traces 610, 612 and the outer traces 614, 616. In other cases, the channel can be an additional material placed onto the sensor plate 626 and between the inner trace 610, 612 and outer traces 614, 616.

Surrounding each channel 618, 620 of electrodes 602, 604 can be an outer trace 614, 616. The outer trace 614, 616 can be circular or annular and can be comprised of the same material as the inner trace 610, 612 such as gold-plating (for example, gold-plated copper (for example, gold-plated copper, silver-plated copper, tin-silver plated copper, and tin-lead plated copper). It can have a similar thickness as the exposed portion of the inner traces 610, 612, as illustrated in FIG. 6. Alternatively, it can be thinner or thicker than the inner traces 610, 612. As with the inner traces 612, 612, the feed-thru pins 606, 608 can be centered on the outer traces 614, 616. Therefore, in one embodiment, the inner traces 610, 612, channels 618, 620, and outer traces 622, 624 can be a series of rings that are centered on one another, as illustrated in FIG. 6, and the thru-pins 606, 608 can be centered within this series of rings. Alternatively, the inner traces, channels, and outer traces may be solid circular pieces that are centered and stacked on top of one another with the feed-thru pins penetrating through all layers.

In general, the greater the space between all electrodes the better, however practical design constraints will limit what can be achieved. The relative sizes of the outer and inner traces and the channels between can impact the effectiveness of the galvanic blocking pattern. Since solder on the outer ring would connect mixed metals and would diminish the effectiveness of the galvanic blocking pattern, the channels can be wide enough such that easy soldering of the feed-thru pin can occur without getting solder on the outer ring. The bridge going from the inner trace to the outer trace (explained in more detail below) should be as narrow as allowed by the manufacturing process creating the patterns. The radius of the inner trace need only be large enough to permit a good solder attachment to the feed-thru pin.

Connecting the inner traces 610, 612 to the outer traces 614, 616 on electrodes 602, 604 can be the bridges 622, 624. Bridges 622, 624 can be a straight portion of material that connect on a first end to inner traces 610, 612 and on a second end to outer traces 614, 616. They may have the same width as inner traces 610, 612, the same width as outer traces 614, 616, or a different width than either. In some embodiments, bridges 622, 624 are comprised as the same material as the inner traces 610, 612 and the outer traces 614, 616 (for example, gold-plated copper, silver-plated copper, tin-silver plated copper, and tin-lead plated copper). Further, the inner traces 610, 612, outer traces 614, 616, and bridges 622, 624 can all be on the same horizontal plane such that they are all positioned relatively flat on the sensor plate 626. The orientation of bridges 622, 624 on the collector electrode 602 and grounding electrode 604, respectively, can be symmetrical, mirrored, or any other configuration.

More specifically, in some embodiments, each electrode 602, 604 can have at least a first side and a second side. The bridge 622 on the collector electrode 602 can be on the first side of the collector electrode, the grounding electrode 604 can be nearest the second side of the collector electrode, and the second side of the collector electrode can be opposite the first side of the collector electrode. Further, the bridge 624 on the grounding electrode 604 can be on a first side of the grounding electrode, the collector electrode 602 can be nearest the second side of the grounding electrode, and the second side of the grounding electrode can be opposite the first side of the grounding electrode. This "mirror" configuration of the collector electrode 602 and grounding electrode 604 can be seen in FIG. 6, wherein the first side of the collector electrode 602 is a left side and the first side of the grounding electrode 604 is a right side (i.e., the bridges are on opposite sides). However, the electrodes are not limited to this left-right configuration, and, in some cases, the bridges may be otherwise mirrored on opposite ends (for example, top and bottom, right and left, or opposite corners) or the bridges may both be on the same side such that they are symmetrical (for example, both bridges are on the top, left, right or bottom) of their respective electrodes. In other embodiments, the bridges can be randomly placed such that they do not have a clear symmetrical or mirrored configuration relative to each other.

Whereas, in the prior art, the inner trace has a connection line 514, 516, in the current disclosure, the connection line 628, 630 is instead paired to outer traces 614, 616 for each electrode 602, 604. In some cases, the connection line may be a continuation of the respective bridge, as illustrated by the middle, grounding electrode in FIG. 4 that is positioned between the bias electrode and the collector electrode. In other cases, the connection line may be separate from the bridge on the electrode, as illustrated by the rightmost collector electrode in FIG. 4. For example, one or more of the connection lines 628, 630 may be positioned 90 degrees away from the bridges 622, 624, as illustrated in FIG. 6.

In use, a photoionization detector with the improved geometry and architecture for the sensor electrodes can be used by activating a gas discharge lamp and reading an output of the amplifier. The gas discharge lamp can have a UV light source and can ionize molecules of interest to create ionized molecules and electrons. The ionized molecules can be collected by a bias electrode 302 on a sensor 300, and the electrons can be collected by a collector electrode 304 on the sensor, wherein the collector electrode can further be connected to an amplifier. A grounding electrode 306 on the sensor can be located between the bias electrode 302 and the collector electrode 304. The collector electrode 304 and the grounding electrode 306 can each include a feed-thru pin 308, 310, an inner trace 312, 314 surrounding the feed-thru pin, an outer trace 320, 322 surrounding the inner trace, a channel 316, 318 between the inner trace and outer trace, and a bridge 324, 326 connecting the outer trace with the inner trace. In some embodiments, the outer trace 320, 322 on both electrodes is comprised of the same material. Further, the channel 316, 318 can be comprised of a different material than the outer trace 320, 322 and the inner trace 312, 314.

The various embodiments described above are provided by way of illustration only and should not be construed to limit the claims attached hereto. Those skilled in the art will readily recognize various modifications and changes that may be made without following the example embodiments and applications illustrated and described herein and without departing from the true spirit and scope of the following claims.

What is claimed is:

1. A photoionization detector, the photoionization detector comprising:
a sensor comprised of at least a collector electrode and a grounding electrode, wherein the collector electrode and the grounding electrode both include
a feed-thru pin,
an inner trace surrounding the feed-thru pin,
an outer trace surrounding the inner trace, wherein the outer trace on each electrode is comprised of the same material,
a channel between the inner trace and the outer trace, wherein the channel is comprised of a different material than the outer trace and the inner trace, and
a bridge connecting the outer trace with the inner trace;
a gas discharge lamp that ionizes molecules of interest to create ionized molecules and electrons, wherein ionized molecules are collectable by a bias electrode and electrons are collectable by the collector electrode; and
an amplifier connected to the collector electrode.

2. The photoionization detector of claim 1, wherein the channel is comprised of a hydrophobic material.

3. The photoionization detector of claim 2, wherein the hydrophobic material is polytetrafluoroethylene.

4. The photoionization detector of claim 1, wherein the inner trace is comprised of gold-plating.

5. The photoionization detector of claim 1, wherein the feed-thru pin is soldered in place.

6. The photoionization detector of claim 5, wherein the solder surrounds the feed-thru pin and covers at least a portion of the inner trace.

7. The photoionization detector of claim 1, wherein the inner trace, the outer trace, and the bridge are comprised of the same material.

8. The photoionization detector of claim 7, wherein the inner trace, the outer trace, and the bridge are comprised of gold-plated copper.

9. The photoionization detector of claim 1, wherein the outer trace is annular.

10. The photoionization detector of claim 9, wherein the feed-thru pin is centered within the outer trace.

11. The photoionization detector of claim 1, wherein
the bridge on the collector electrode is on a first side of the collector electrode,
the grounding electrode is nearest a second side of the collector electrode, and
the second side of the collector electrode is opposite the first side of the collector electrode.

12. The photoionization detector of claim 11, wherein
the bridge on the grounding electrode is on a first side of the grounding electrode,
the collector electrode is nearest a second side of the grounding electrode, and
the second side of the grounding electrode is opposite the first side of the grounding electrode.

13. The photoionization detector of claim 1, wherein the grounding electrode is positioned between the bias electrode and the collector electrode.

14. A photoionization detector sensor, the photoionization detector sensor comprising:
at least two electrodes including a collector electrode and a grounding electrode, wherein each electrode includes
a feed-thru pin,
an inner trace surrounding the feed-thru pin,
an outer trace ring surrounding the inner trace, wherein the outer trace ring on each electrode is comprised of the same material, a channel between the inner trace and the outer trace ring, wherein the channel is comprised of a different material than the outer trace ring and the inner trace, and a bridge connecting the outer trace ring with the inner trace, wherein the inner trace, the outer trace, and the bridge are comprised of the same material, wherein the feed-thru pin is centered within the outer trace, and wherein the bridge on the collector electrode is on an opposite side compared to the bridge on the grounding electrode.

15. The photoionization detector sensor of claim 14, further comprising a bias electrode.

16. The photoionization detector sensor of claim 15, in combination with a gas discharge lamp that ionizes molecules of interest to create ionized molecules and electrons, wherein ionized molecules are collectable by the bias electrode and electrons are collectable by the collector electrode, and an amplifier connected to the collector electrode.

17. A method of using a photoionization detector, the method comprising:

activating a gas discharge lamp, wherein the gas discharge lamp ionizes molecules of interest to create ionized molecules and electrons, the ionized molecules are collectable by a bias electrode on a sensor, the electrons are collectable by a collector electrode on the sensor, wherein the collector electrode is connected to an amplifier; and reading an output of the amplifier, wherein a grounding electrode on the sensor and the collector electrode each include a feed-thru pin, an inner trace surrounding the feed-thru pin, an outer trace surrounding the inner trace, wherein the outer trace on the electrodes is comprised of the same material, a channel between the inner trace and the outer trace, wherein the channel is comprised of a different material than the outer trace and the inner trace, and a bridge connecting the outer trace with the inner trace, and wherein the channel is configured to minimize galvanic currents.

* * * * *